(12) United States Patent
Lin et al.

(10) Patent No.: US 11,682,851 B2
(45) Date of Patent: Jun. 20, 2023

(54) DISPLAY DEVICE AND CONNECTION METHOD THEREOF

(71) Applicant: AU OPTRONICS CORPORATION, Hsin-Chu (TW)

(72) Inventors: I-Chieh Lin, Hsin-Chu (TW); Keng-Yi Lee, Hsin-Chu (TW); Shu-Juien Huang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 80 days.

(21) Appl. No.: 17/496,800

(22) Filed: Oct. 8, 2021

(65) Prior Publication Data

US 2022/0115798 A1    Apr. 14, 2022

(30) Foreign Application Priority Data

Oct. 12, 2020 (TW) .................... 109135232

(51) Int. Cl.
*H01R 12/70* (2011.01)
*H01R 12/77* (2011.01)
*H05K 1/18* (2006.01)

(52) U.S. Cl.
CPC ....... *H01R 12/7076* (2013.01); *H01R 12/778* (2013.01); *H05K 1/189* (2013.01); *H05K 2201/056* (2013.01); *H05K 2201/10128* (2013.01)

(58) Field of Classification Search
CPC .. H01R 12/7076; H01R 12/778; H05K 1/189; H05K 2201/056; H05K 2201/10128
USPC ........................................... 361/749
See application file for complete search history.

(56) References Cited

U.S. PATENT DOCUMENTS

2015/0366050 A1* 12/2015 Noh .................. H01L 24/50
361/749
2018/0356686 A1* 12/2018 Yeh ................. G02F 1/133608

FOREIGN PATENT DOCUMENTS

CN        208367366        1/2019

* cited by examiner

*Primary Examiner* — Andargie M Aychillhum
(74) *Attorney, Agent, or Firm* — WPAT, P.C

(57) ABSTRACT

A display device is disclosed. The display device includes: a first substrate having a first surface and a second surface; a second substrate having a third surface and a fourth surface; and a connection module connected between the first substrate and the second substrate. The connection module further includes: a first connection section having two ends respectively connected to a first connection portion and a second connection portion, wherein the first connection portion is connected to the first surface of the first substrate, and the second connection portion is connected to the third surface of the second substrate; a second connection section having two ends respectively connected to the first connection portion and a third connection portion, wherein the third connection portion is connected to the second substrate.

14 Claims, 7 Drawing Sheets

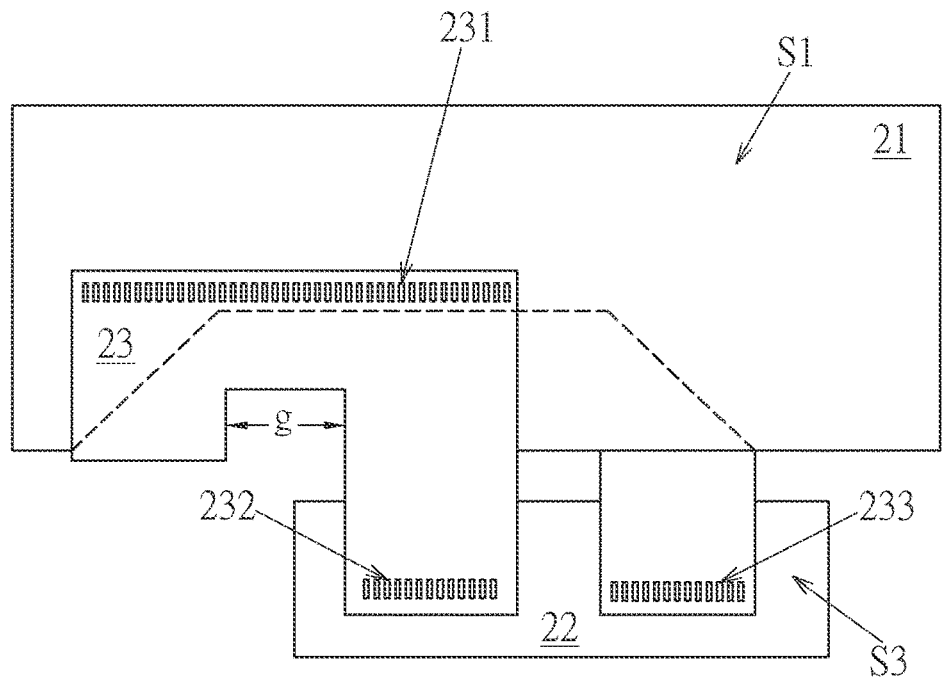

FIG. 5

- S301 — providing a first substrate, a second substrate, and a connection module with a first connection section and a second connection section, wherein, two ends of the first connection section are respectively connected to a first connection portion and a second connection portion, two ends of the second connection section are respectively connected to the first connection portion and a third connection portion

- S302 — connecting the first connection portion to the first surface of the first substrate, and connecting the second connection portion to the third surface of the second substrate

- S303 — connecting the third connection portion of the second connection section to the second substrate, wherein at least part of the second connection section overlaps the second surface

FIG. 6

DISPLAY DEVICE AND CONNECTION METHOD THEREOF

TECHNICAL FIELD

The present invention generally relates to a display device, in particular, to a display device of a connection method.

Related Art

FIG. 1 shows that with the technology of existing display devices, signal transmission may be carried out between the display panel and the circuit board or other substrates by a connecting line such as a flexible circuit board. When the difference between the sizes of the contact points at the two ends of the connecting line is too large, for example, when the circuit board 12 in the display device keeps shrinking or the circuit board 11 keeps growing, the connecting line 13 connecting the circuit board 11 and the circuit board 12 will also become more and more inclined, and the angle between the connecting line 13 and the substrate 11 will become larger and larger, causing each transmission line in the connecting line 13 to have a different inclination angle from each other, and the length of each line will also be different, resulting in inconsistent transmission signals and the problem of easy breaking of the bond between the connecting line and the circuit board 12.

SUMMARY

Therefore, the present invention proposes a display device and a connection method thereof to solve the problem of having too large of a size difference between the substrates or contact points at two ends of a connecting line, which causes the connecting line to be too inclined, and other possible issues which may arise.

The present invention provides a display device, including: a first substrate having a first surface and a second surface; a second substrate having a third surface and a fourth surface; and a connection module connected between the first substrate and the second substrate. The connection module further includes: a first connection section with two ends being respectively connected to a first connection portion and a second connection portion, wherein the first connection portion is connected to the first surface of the first substrate and the second connection portion is connected to the third surface of the second substrate; a second connection section with two ends being respectively connected to the first connection portion and a third connection portion, wherein the third connection portion is connected to the second substrate.

An embodiment of the present invention provides a connection method of a display device. The connection method includes: providing a first substrate having a first surface and a second surface, a second substrate having a third surface and a fourth surface, and a connection module with a first connection section and a second connection section, wherein two ends of the first connection section are respectively connected to a first connection portion and a second connection portion, two ends of the second connection section are respectively connected to the first connection portion and a third connection portion; connecting the first connection portion to the first surface of the first substrate, and connecting the second connection portion to the third surface of the second substrate; and connecting the third connection portion of the second connection section to the second substrate, wherein at least part of the second connection section overlaps with the second surface.

In order to further understand the features and technical content of the present invention, please refer to the following detailed descriptions and schemas of the present invention. However, the schemas provided are only for reference and description and are not used to limit the present invention.

BRIEF DESCRIPTION OF THE DRAWINGS

FIG. 5 shows that the second connection portion and the third connection portion are simultaneously connected to the third surface of the second substrate.

FIG. 6 is a flowchart showing a connection method of a display device according to an embodiment of the present invention.

DETAILED DESCRIPTION

Figure 1:
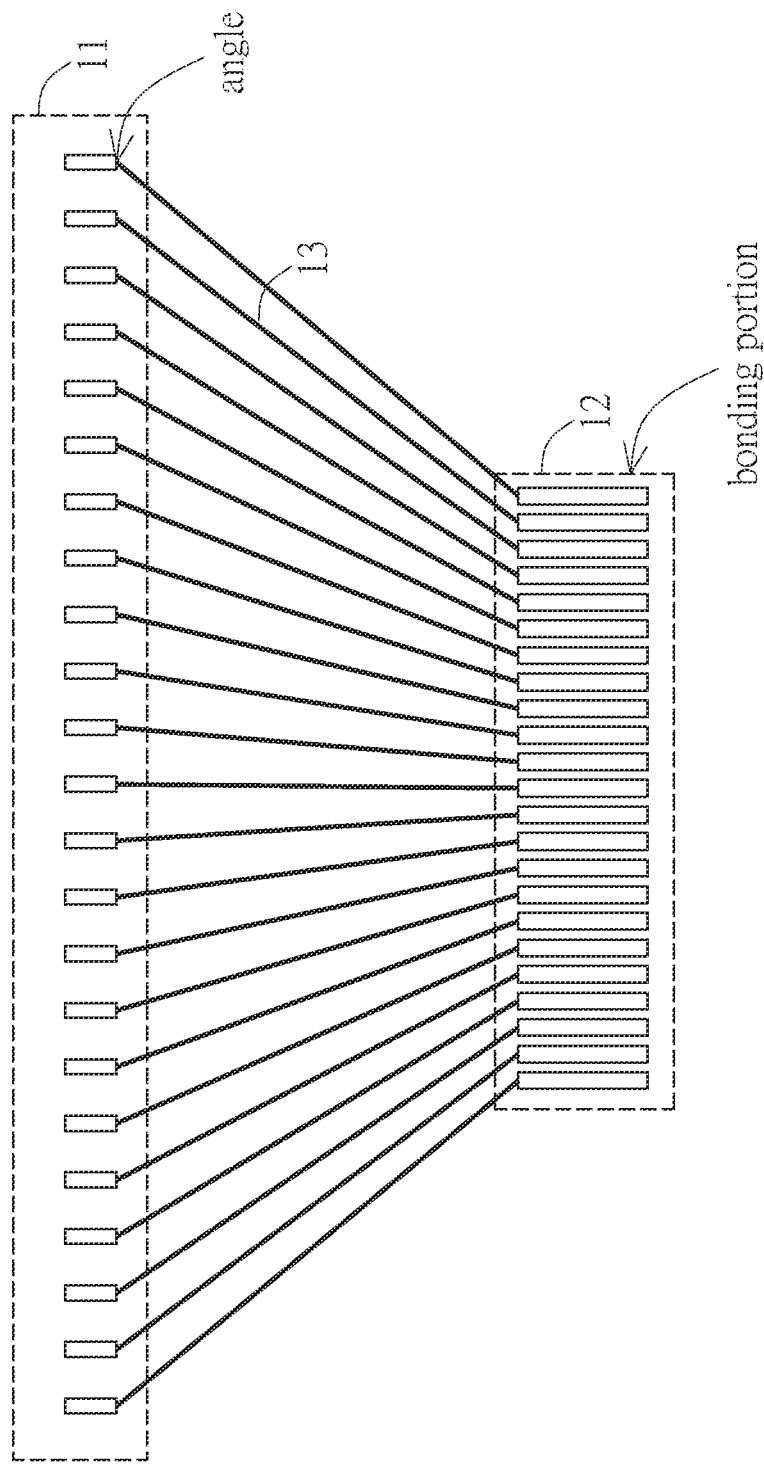
FIG. 1 shows the connection method of a traditional display device.

The following uses specific embodiments in conjunction with FIGS. 2A to 6 to illustrate the embodiments of the optical lens, light-emitting device, and backlight module disclosed in the present invention. Those skilled in the art can understand the advantages and effects of the present invention from the content disclosed in this specification. However, the content disclosed below is not intended to limit the scope of protection of the present invention. Without departing from the spirit of the concept of the invention, those skilled in the art can realize the invention in other different embodiments based on different viewpoints and applications.

In the drawings, for clarity of description, all shown are simplified schematic diagrams to illustrate the basic structures of the present invention. Therefore, the structures shown in the drawings does not follow the actual shape and size ratio. For example, for the convenience of explanation, the size of a specific component is enlarged. In addition, it should be understood that when an element such as a layer, film, region, or substrate is referred to as being "on" or "connected to" another element, it can be directly on or connected to the other element, or intermediate elements may also exist. In contrast, when an element is referred to as being "directly on" or "directly connected to" another element, there are no intervening elements. As used herein, "connected" can refer to physical and/or electrical connection. Furthermore, "electrical connection" or "coupling" can mean that there are other elements between two elements.

Unless otherwise defined, all terms (including technical and scientific terms) used herein have the same meaning as commonly understood by those of ordinary skill in the art to which the present invention belongs. It will be further understood that terms such as those defined in commonly used dictionaries should be interpreted as having meanings consistent with their meanings in the context of related technologies and the present invention, and will not be interpreted as having an idealized or excessively formal meaning, unless explicitly defined as such in this article.

Figure 2A:
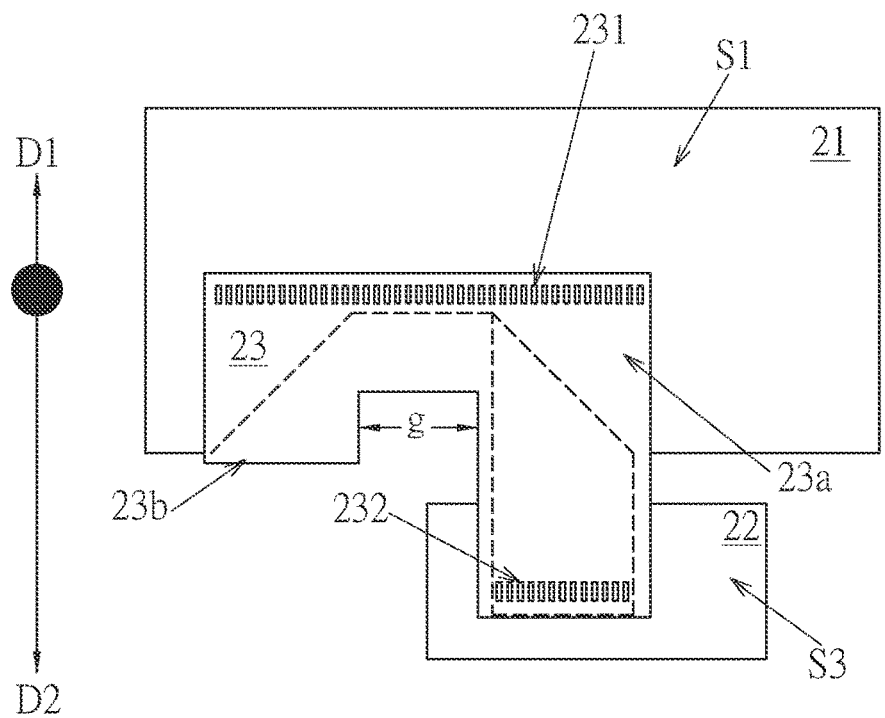
FIG. 2A shows the front view of a display device according to an embodiment of the present invention.
Figure 2B:
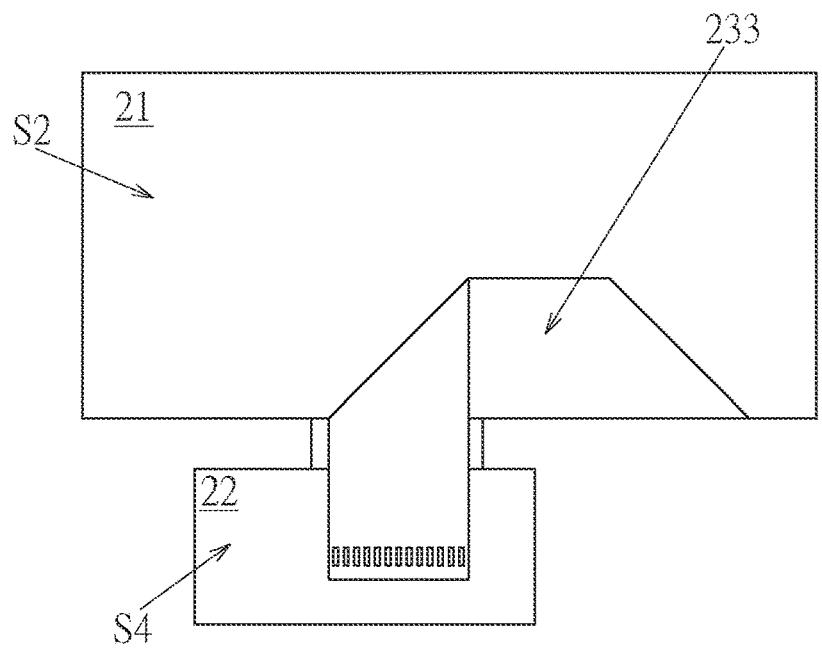
FIG. 2B shows the rear view of a display device according to an embodiment of the present invention.

FIG. 2A shows the front view of the display device 2 according to an embodiment of the present invention, and FIG. 2B shows the rear view of the display device 2 according to an embodiment of the present invention. As shown in FIGS. 2A and 2B, the display device of the present invention includes a first substrate 21, a second substrate 22, and a connection module 23. The first substrate 21 has a first surface S1 and a second surface S2, the second substrate 22 has a third surface S3 and a fourth surface S4, and the connection module 23 is connected between the first substrate 21 and the second substrate 22. The connection module 23 includes a first connection section 23a and a second connection section 23b. Two ends of the first connection section 23a are respectively connected to the first connection portion 231 and the second connection portion 232. The first connection portion 231 is electrically or physically connected to the first surface S1 of the first substrate 21, and the second connection portion 232 is electrically or physically connected to the third surface S3 of the second substrate 22. As shown in FIGS. 2A and 2B, two ends of the second connection section 23b are respectively connected to the first connection portion 231 and the third connection portion 233, wherein the first connection portion 231 is electrically or physically connected to the surface S1 of the first substrate 21, and the third connection portion 233 is electrically or physically connected to the second substrate 22. In this embodiment, the first connection section 23a and the second connection section 23b are connected to each other at the ends connected to the first connection portion 231. In particular, part of the first connection section 23a and part of the second connection section 23b may be arranged in parallel, and there is a distance g between them. In addition, as shown in FIG. 2A, the first connection section 23a and part of the second connection section 23b overlap each other and are parallel. In this embodiment, the first substrate 21 can be a display array substrate, the second substrate 22 can be a printed circuit board, and the connection module 23 can be a flexible circuit substrate.

Figure 3A:
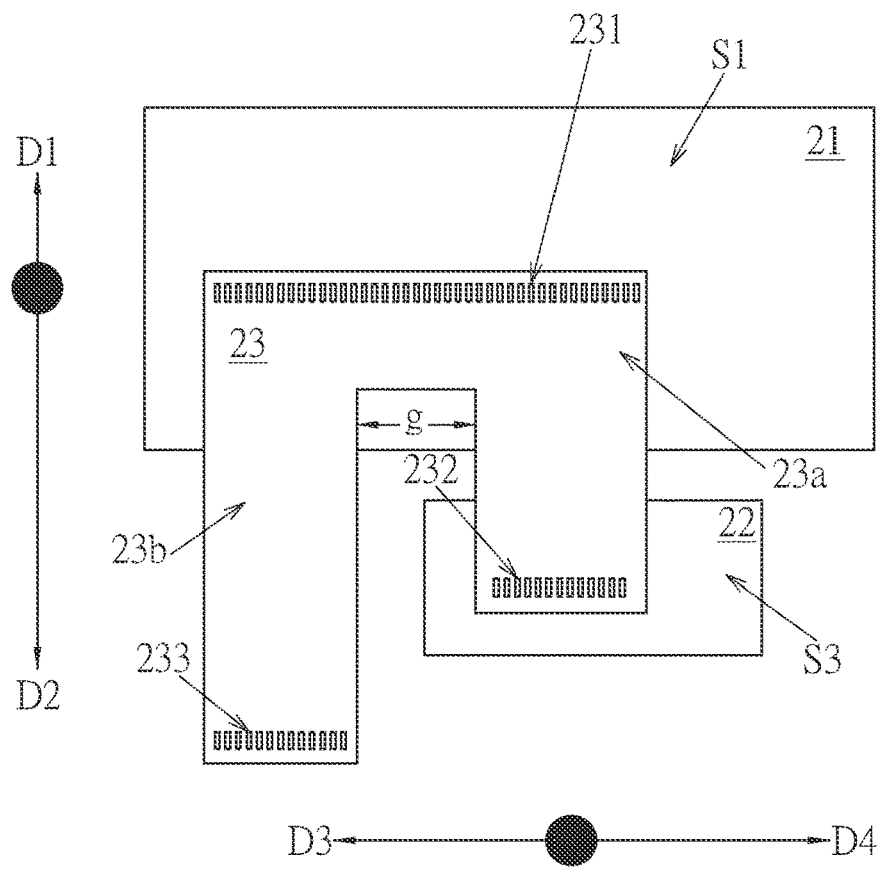
FIG. 3A to 3D are schematic diagrams of the connection between the connection module and the second substrate.

FIGS. 3A to 3D show schematic diagrams of bending the connection module 23 to connect with the second substrate 22. As shown in FIG. 3A, before the second connection section 23b is bent, it is parallel to the first connection section 23a, and there is a distance g between the first connection section 23a and the second connection section 23b. At this time, the first connection section 23a and the second connection section 23B extend toward the first direction D1 to connect the first connection portion 231 with the first substrate 21, while the first connection section 23a and the second connection section 23B extend toward the second direction D2, wherein the first direction D1 is opposite to the second direction D2. At this time, the second connection portion 232 is connected to the second substrate 22, and the third connection portion 233 is not connected to the surface of any substrate. In addition, preferably, the length of the first connection section 23a is shorter than the length of the second connection section 23b.

Figure 3B:
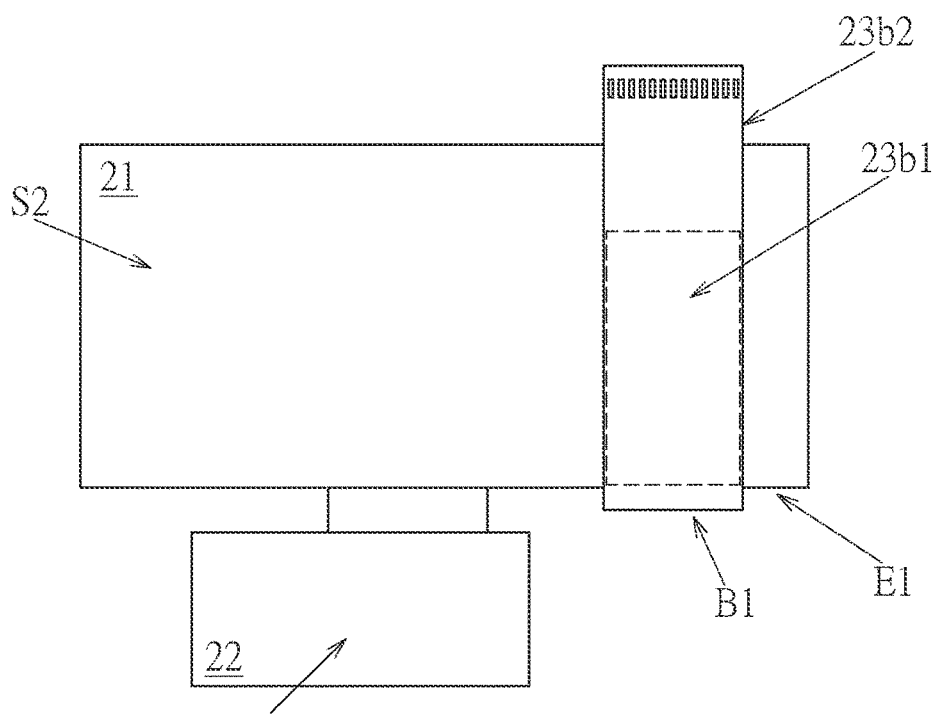

As shown in FIG. 3B, the second connection section 23b is bent toward the second surface S2 of the first substrate relative to the first end edge E1 to form a first section 23b1, a second segment 23b2, and a first bend B1. The first bend B1 is located between the first segment 23b1 (dotted frame) and the second segment 23b2, and outside the first end edge E1 of the first substrate 21, wherein the first segment 23b1 and the second segment 23b2 overlap with the first surface S1 and the second surface S2 respectively.

Figure 3C:
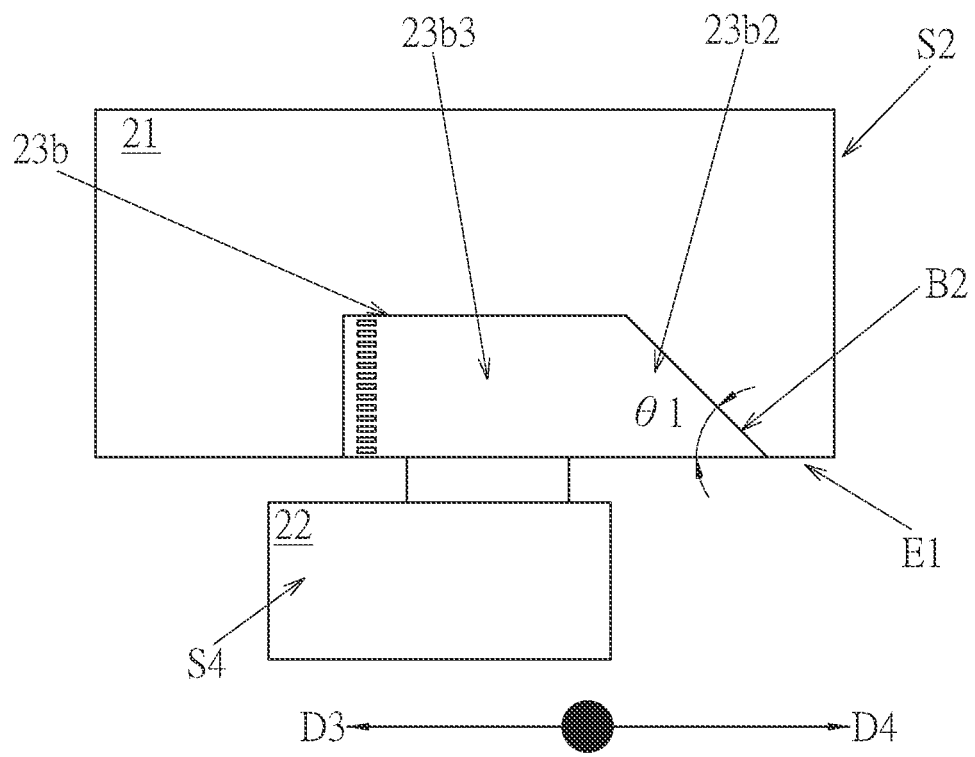

As shown in FIG. 3C, continue to bend and extend the second segment 23b2 in the second connection section 23b with the second bend B2 as the folding line. Since the second bend B2 is inclined with respect to the first end edge E1, a first bending angle θ1 is formed between the second bend B2 and the first end edge E1, and the angle range of the aforementioned first bend angle θ1 can be 0~90 degrees. The second segment 23b2 changes the extending direction through the second bend B2 to form a third segment 23b3, and the third segment 23b3 extends along the first end edge E1. The second bend B2 is located between the second segment 23b2 and the third segment 23b3. At this time, the second connection section 23b and the second substrate 22 are parallel to each other.

Figure 3D:
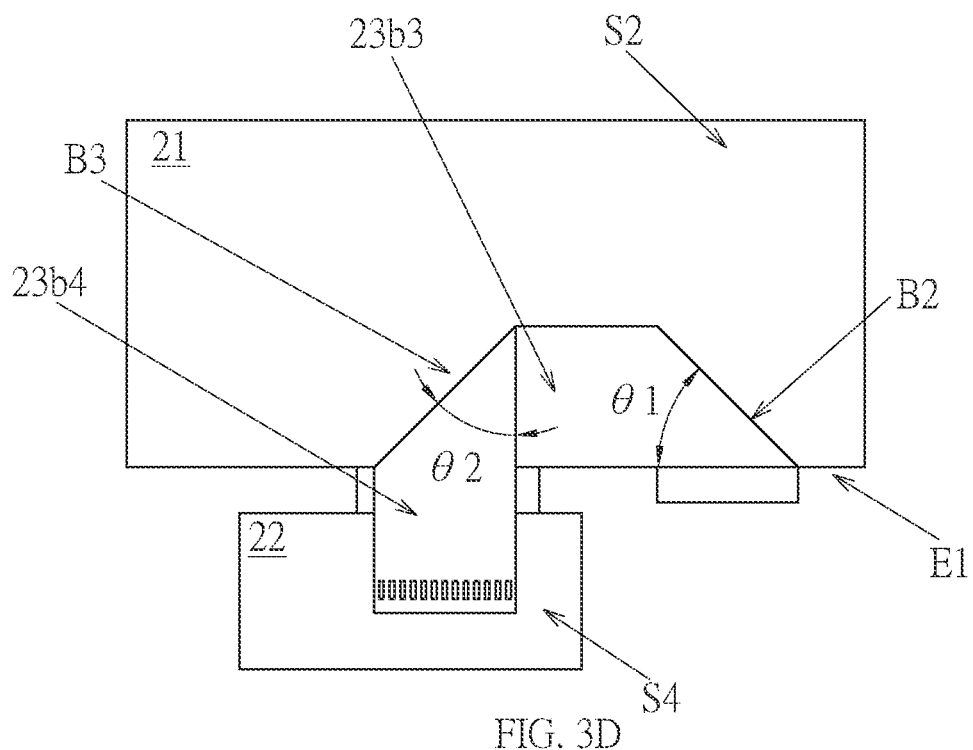

As shown in FIG. 3D, continue to bend and extend the third segment 23b3 of the second connection section 23b towards the second direction D2 with the third bend B3 as the fold line to form the fourth segment 23b4 and the second bending angle θ2. The angle range of the first bending angle θ2 can be 0 to 90 degrees, the fourth segment 23b4 extends across the first end edge E1 and extends to overlap with one of the third surface S3 and the fourth surface S4. At this time, the fourth segment 23b4 is connected to the third surface S3 or the fourth surface S4 of the second substrate 22. In this embodiment, the first connection section 23a and the second connection section 23b can be parallel to and overlap each other, and the fourth segment 23b4 is connected to the fourth surface S4 of the second substrate 22. With this arrangement, the signal from the first surface S1 or the first connection portion 231 can be transmitted in a shunted manner to the second substrate 22 through the first connection section 23a and the second connection section 23b respectively, so as to reduce problems in circuit design due to the increase of lines.

In another embodiment, the second connection section 23b and the first connection section 23a can be parallel to each other but not overlapping. Furthermore, the third connection portion 233 on the fourth segment 23b4 of this embodiment can be connected to the center (not shown) or the side of the third surface S3 or the fourth surface S4.

Figure 4A:
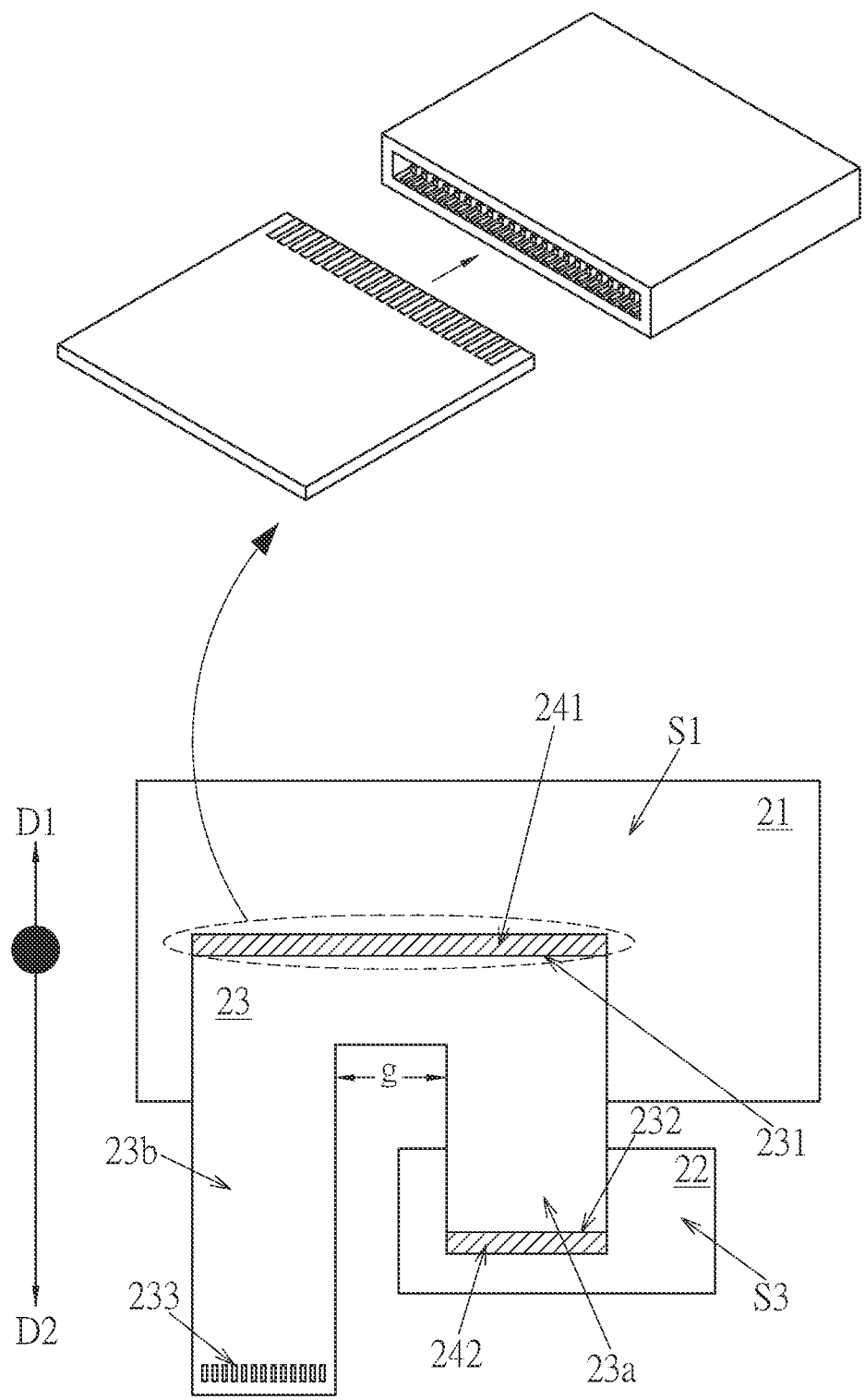
FIG. 4A shows that the first connection portion and the second connection portion connected by the first connection section are respectively connected to the first connection port and the second connection port.
Figure 4B:
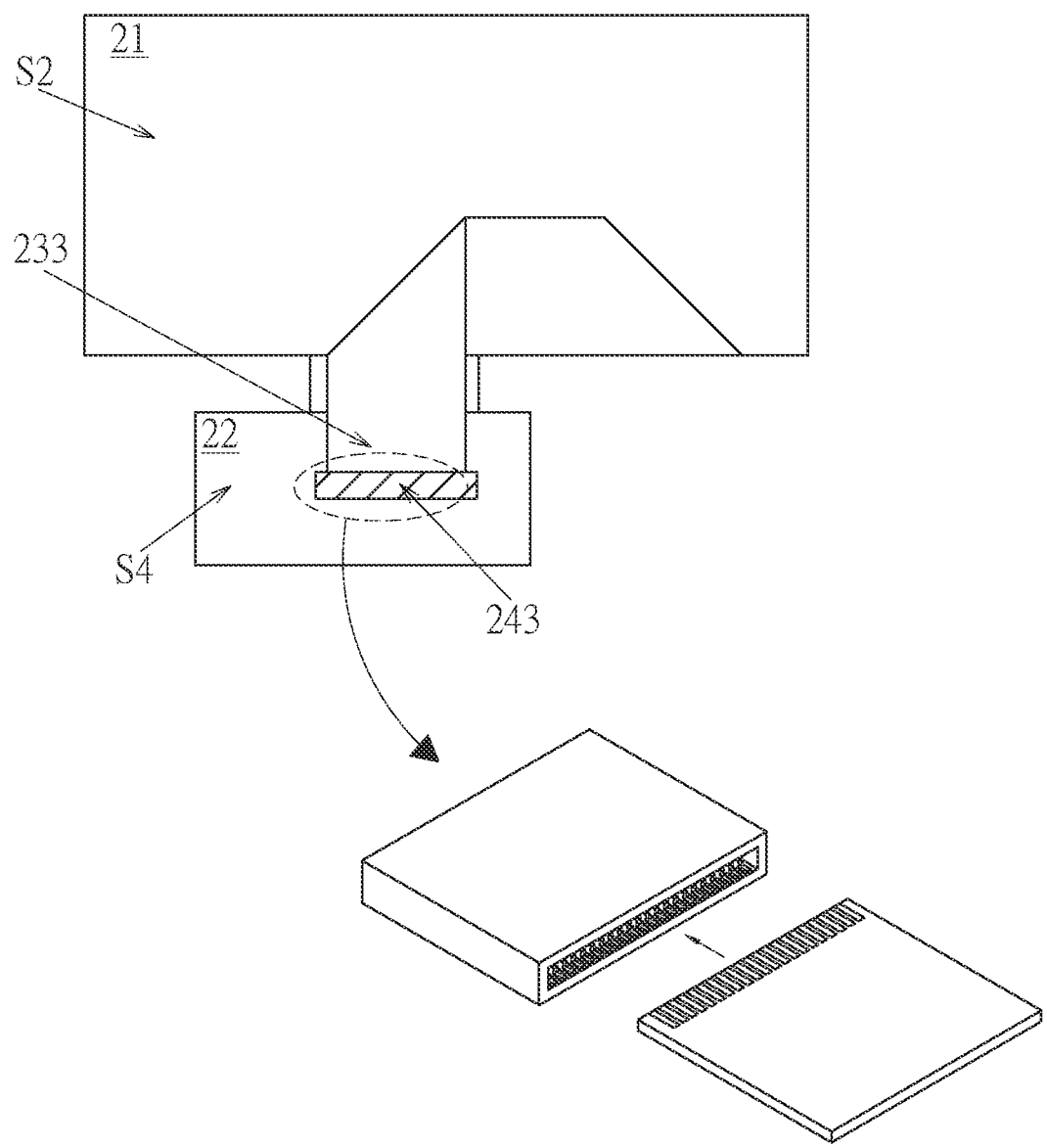
FIG. 4B shows that the third connection portion of the second connection section is connected to the third connection port.

In this embodiment, the first connection portion 231, the second connection portion 232, and the third connection portion 233 can be connected to the first substrate 21 and the second substrate 22 respectively by either bonding or non-bonding. In another embodiment, the first connection portion 231 can be inserted into the first connection port 241 of the first substrate 21, the second connection portion 232 can be inserted into the second connection port 242 of the second substrate 22, and the third connection portion 233 can be inserted into the third connection port 243 of the second substrate 22, as shown in FIGS. 4A and 4B. FIGS. 4A and 4B are schematic diagrams of section insertion port. FIG. 4A shows that the first connection portion 231 and the second connection portion 232 connected to the first connection section 23a are connected to the first connection port 241 and the second connection port 242, respectively. FIG. 4B shows that the third connection portion 233 of the second connection section 23b is connected to the third connection port 243. The first connection port 241, the second connection port 242, and the third connection port 243 can be plug-in connection sockets for insertion of the first connection portion 231, the second connection portion 232, or the third connection portion 233.

In another embodiment, the second connection portion 232 and the third connection portion 233 can be simultaneously connected to the third surface S3 or the fourth surface S4 of the second substrate, as shown in FIG. 5. FIG. 5 shows that the second connection portion 232 and the third connection portion 233 are simultaneously connected to different positions on the third surface S3 of the second substrate 22 to reduce crowding. Similarly, the second connection portion 232 and the third connection portion 233 can also be simultaneously connected to the fourth surface S4 of the second substrate 22, but are not limited thereto. In addition, the second connection section 23b and the first connecting section 23a can be bonded to the same surface of the second substrate 22 in parallel without overlapping each other. As shown in FIG. 5, the third segment 23b3 extends from one side of the first connecting section 23b to the other side, that is, across the first connection section 23b, so that the fourth segment 23b4 and the first segment 23b1 are located on different sides of the first connection section 23b to increase the flexibility of the circuit layout.

FIG. 6 is a flowchart showing a connection method of a display device according to an embodiment of the invention. Please refer to FIGS. 2A and 2B at the same time. This method includes providing a first substrate 21 with a first surface S1 and a second surface S2, a second substrate 22 with a third surface S3 and a fourth surface S4, and a connection module 23 with a first connection section 23a and a second connection section 23b, wherein the two ends of the first connection section 23a are respectively connected to the first connection portion 231 and the second connection portion 232, and the two ends of the second connection section 23b are respectively connected to the first connection portion 231 and a third connection portion 233 (S301). Next, connect the first connection portion 231 to the first surface S1 of the first substrate 21, the second connection portion 232 to the third surface S3 of the second substrate 22 (step S302), and the third connection portion 233 of the second connection section 23b to the second substrate 22, wherein at least part of the second connection section 23b overlaps with the second surface S2 (step S303). In particular, part of the first connection section 23a and the second connection section 23b can be arranged in parallel, and there is a distance g between them. In addition, as shown in FIG. 2B, the first connection section 23a and part of the second connection section 23b overlap each other and are parallel. In this embodiment, the first substrate 21 can be a display array substrate, the second substrate 22 can be a printed circuit board, and the connection module 23 can be a flexible circuit substrate.

In this embodiment, it further includes extending the first connecting section 23a towards the first direction D1, so that the first connection portion 231 is connected to the first substrate 21, and the first connection section 23a extends towards the second direction D2 so that the second connection portion 232 is connected to the second substrate 22, and the first direction D1 is opposite to the second direction D2.

The embodiment further includes bending and extending the second connecting section 23b towards the third direction D3 to generate a first bend B1, then extending the third connection portion 233 towards the third direction D3, and making the second connection section 23b parallel to the second substrate 22. Next, the second connection section 23b is bent to generate a second bend B2, and then the third connection portion 233 is extended towards the second direction D2, so that the second connection section 23b and the second substrate 22 are perpendicular to each other, and the third connection portion 233 is connected to either the third surface S3 or the fourth surface S4. The method may also connect the second connection portion 232 to the center or side end of the third surface S3 of the second substrate 22, and the third connection portion 233 to the center or side end of the third or fourth surface of the second substrate 22.

The embodiment further includes reducing the size of the second substrate 22 to make it smaller than the first substrate 21 to expose the first connection port 241 on the first substrate 21, wherein the first connection port 241 is disposed on the first surface S1 to connect to the first segment 231. The display device 2 further includes a second connection port 242, which is disposed on the third surface S3 to connect to the second segment 242.

More specifically, in this embodiment, before the second connection section 23b is bent, it is parallel to the first connection section 23a, and there is a distance g between the first connection section 23a and the second connection section 23b. At this time, the first connection section 23a and the second connecting section 23b extend towards the first direction D1 to connect the first connection portion 231 to the first substrate 21, while the first connection section 23a and the second connection section 23b extend towards the second direction D2, wherein the first direction D1 is opposite to the second direction D2. At this time, the second connection portion 232 is connected to the second substrate 22, and the third connection portion 233 is not connected to the surface of any substrate. In addition, preferably, the length of the first connection section 23a is shorter than the length of the second connection section 23b.

Next, the second connection section 23b is bent towards the second surface S2 of the first substrate relative to the first end edge E1 to form a first segment 23b1, a second segment 23b2, and a first bend B1. The first bend B1 is located between the first segment 23b1 (dashed frame) and the second segment 23b2, outside the first end edge E1 of the first substrate 21, and the first segment 23b1 and the second segment 23b2 are overlapped with the first surface S1 and the second surface S2 respectively. Continue to bend and extend the second segment 23b2 of the second connection section 23b with the second bend B2 at the folding line. Since the second bend B2 is inclined relative to the first end edge E1, a first bend angle θ1 is formed between the second bend B2 and the first end edge E1, and the angle range of the aforementioned first bend angle θ1 can be 0~90 degrees. The second segment 23b2 changes the extending direction through the second bend B2 to form a third segment 23b3, and the third segment 23b3 extends along the first end edge E1. The second bend B2 is located between the second segment 23b2 and the third segment 23b3. At this time, the second connection section 23b and the second substrate 22 are parallel to each other.

At the same time, continue to bend and extend the third segment 23b3 of the second connection section 23b with the third bend B3 as the fold line towards the second direction D2 to form the fourth segment 23b4 and the second bending angle θ2. The angle range of the aforementioned first bending angle θ1 can be 0 to 90 degrees, and the fourth segment 23b4 extends across the first end edge E1 and overlaps with either the third surface S3 or the fourth surface S4. At this time, the fourth segment 23b4 is connected to either the third surface S3 or the fourth surface S4 of the second substrate 22. In this embodiment, the first connection section 23a and the second connection section 23b can be parallel to and overlap each other, and the fourth segment 23b4 is connected to the fourth surface S4 of the second substrate 22. With this arrangement, the signal from the first surface S1 or the first connection portion 231 can be transmitted in a shunted manner to the second substrate 22 through the first connecting section 23a and the second connecting section 23b respectively, so as to reduce problems in circuit design caused by the increase of lines. In another embodiment, the second connection sections 23b and the first connection section 23a can be parallel to each other but do not overlap.

The contents disclosed above are only preferred and feasible embodiments of the present invention, which does not limit the scope of the patent application of the present invention. Therefore, all equivalent technical changes made by using the contents of the description and schematic of the present invention fall within the scope of patent application of the present invention.

What is claimed is:

1. A display device, including: a first substrate, having a first surface and a second surface; a second substrate, having a third surface and a fourth surface; and a connection module, connected between the first substrate and the second substrate, the connection module further including: a first connection section, two ends of the first connection section respectively connected to a first connection portion and a second connection portion, wherein the first connection portion is connected to the first surface of the first substrate, the second connection portion is connected to the third surface of the second substrate; a second connection section, two ends of the second connection section respectively connected to the first connection portion and a third connection portion, wherein the third connection portion is connected to the second substrate, wherein the first substrate has a first end edge, the second connection section has a first segment, a first bend, and a second segment, the first bend is located between the first segment and the second segment and located outside the first end edge, wherein the first segment and the second segment respectively overlap with the first surface and the second surface.

2. The display device according to claim 1, wherein the second connection section has a third segment and a second bend, the second segment changes an extending direction through the second bend to form the third segment, and the third segment extends along the first end edge.

3. The display device according to claim 2, wherein the second connection section has a fourth segment and a third bend, the third segment changes the extending direction through the third bend to form the fourth segment, and the fourth segment extends across the first end edge and extends to overlap with one of the third surface and the fourth surface.

4. The display device according to claim 1, wherein the first connection section and the first segment are parallel to each other, and there is a distance between the first connection section and the first segment.

5. The display device according to claim 1, wherein the size of the second substrate is smaller than the first substrate to expose a first connection port on the first substrate, wherein the first connection port is arranged on the first surface to connect the first connection portion.

6. The display device according to claim 5, wherein the display device further includes a second connection port, and the second connection port is arranged on the third surface to connect the second connection portion.

7. The display device according to claim 1, wherein the first substrate is a display array substrate, the second substrate is a printed circuit board, and the connection module is a flexible printed substrate.

8. The display device according to claim 1, wherein the third connection portion is connected to the third surface of the second substrate.

9. The display device according to claim 1, wherein the third connection portion is connected to the fourth surface of the second substrate.

10. A connection method of a display device, including: providing a first substrate having a first surface and a second surface, a second substrate having a third surface and a fourth surface, and a connection module with a first connection section and a second connection section, wherein two ends of the first connection section are respectively connected to a first connection portion and a second connection portion, two ends of the second connection section are respectively connected to the first connection portion and a third connection portion; connecting the first connection portion to the first surface of the first substrate, and connecting the second connection portion to the third surface of the second substrate; and connecting the third connection portion of the second connection section to the second substrate, wherein at least part of the second connection section overlaps with the second surface, ending and extending the first connection section toward a first direction to generate a first segment, a first bend and a second segment, wherein the first bend is located between the first segment and the second segment and located outside a first end edge of the first substrate, the first segment and the second segment overlap to the first surface and the second surface, respectively.

11. The connection method according to claim 10, further including:
  bending and extending the second connection section toward a third direction to generate a third segment and a second bend, wherein the second segment changes an extending direction through the second bend to form the third segment, and the third segment extends along the first end edge.

12. The connection method according to claim 11, further including:
  continuing to bend the second connection section to generate a fourth segment and a third bend, wherein the third segment changes the extending direction through the third bend to form the fourth segment, and the fourth segment extends across the first end edge and extends to overlap with one of the third surface and the fourth surface.

13. The connection method according to claim 12, wherein the first connection section and the second connection section overlap or do not overlap each other.

14. The connection method according to claim 10, wherein the first substrate is a display array substrate, the second substrate is a printed circuit board, and the connection module is a flexible printed substrate.

* * * * *